United States Patent
Matz et al.

[11] Patent Number: 5,821,539
[45] Date of Patent: Oct. 13, 1998

[54] FAST OPERATING RADIATION DETECTOR AND METHOD FOR OPERATING SAME

[75] Inventors: Richard Matz, Bruckmuehl; Andreas Jahnke, Munich, both of Germany

[73] Assignee: Siemens Aktiengesellschaft, Munich, Germany

[21] Appl. No.: 847,762

[22] Filed: Apr. 23, 1997

[30] Foreign Application Priority Data

Apr. 25, 1996 [DE] Germany .................. 196 16 545.8

[51] Int. Cl.⁶ .................................................. G01T 1/24
[52] U.S. Cl. ........................ 250/370.01; 250/370.13; 250/370.14
[58] Field of Search ................. 250/370.01, 370.13, 250/370.14, 370.12, 338.4, 372

[56] References Cited

U.S. PATENT DOCUMENTS

| | | | |
|---|---|---|---|
| 4,837,607 | 6/1989 | Kemmer et al. | 250/338.4 |
| 5,248,885 | 9/1993 | Sato et al. | 250/370.12 |
| 5,391,882 | 2/1995 | Rhiger | 250/370.12 |
| 5,677,539 | 10/1997 | Apotovsky et al. | 250/370.01 |

FOREIGN PATENT DOCUMENTS 34 15 439  10/1985  Germany .
44 42 853  10/1995  Germany .

*Primary Examiner*—Edward J. Glick
*Assistant Examiner*—Darren M. Jiron
*Attorney, Agent, or Firm*—Hill & Simpson

[57] ABSTRACT

A directly converting radiation detector with a diode structure having first and second operating electrodes on opposite sides of a semiconductor body has an additional injector electrode, which injects charge carriers for the compensating charged traps in the semiconductor body. The secondary dark current generated in this way does not flow via the electrode used for measurement purposes and therefore does not influence the measured signal. The injection is facilitated by suitable doping under the injector electrode.

15 Claims, 3 Drawing Sheets

FAST OPERATING RADIATION DETECTOR AND METHOD FOR OPERATING SAME

BACKGROUND OF THE INVENTION

1. Field of the Invention

The present invention is directed to a radiation detector, such as an x-ray detector, and in particular to such a detector which has a fast response time. The present invention is also directed to a method for operating such a detector.

2. Description of the Prior Art

Directly converting detectors that can be operated as a photoconductor, a photo diode or according to the photo voltaic principle can be utilized for detecting electromagnetic radiation in the visible, infrared and ultraviolet range.

Conventionally gas-filled ionization tubes or solid-state scintillators in conjunction with photomultiplier tubes or semiconductor photodiodes are utilized for the quantitative detection of x-radiation and gamma radiation given average quantum energies of 10–150 keV. Whereas the ionizing effect of x-radiation is directly utilized in the former instance for detecting the electrical charges thereby generated, the light-emitting properties of solid-state scintillators in the second instance serve the purpose of first converting the x-radiation into low-energy and, in particular, visible radiation. This can be detected via a light-sensitivie film or a radiation detector for visible light.

Due to their compact and simple structure and high spatial resolution and detection sensitivity, directly converting detectors are also being increasingly utilized for detecting x-radiation and gamma radiation. These are composed of heavy and highly absorbent semiconductor materials such as, for example, $CdTe$, $HgI_2$, $PbI_2$ and some other compound semiconductors. The x-ray energy is directly converted by photo excitation in these detectors into an electrical signal current.

The simplest structure of a directly converting detector is a photoconductor formed by a continuously high-impedance semiconductor with low intrinsic conduction with electrodes on opposite sides of the semiconductor body. The dark current between the two electrodes applied at opposite sides of the semiconductor body can be reduced by a higher band gap of the semiconductor or by selection of electrode materials that generate an adequately high Schoftky barrier to the semiconductor.

A further reduction of the dark current is achieved by a pin diode structure or by p-doping or n-doping the semiconductor under the contacts.

A further criterion in the construction of a directly converting x-ray detector is the layer thickness with which the absorbent, active semiconductor layer is designed. A complete absorption of x-radiation requires an adequate semiconductor layer thickness, for example 1–2 mm given cadmium telluride. A detector having a semiconductor layer of this thickness, however, exhibits electronic disadvantages since a number of the charge carriers generated by the radiation are lost before reaching the electrodes due to recombination and, above all, due to capture at traps (trapping). This reduces the measurable signal current. Moreover, minute charge carriers can remain in the semiconductor, for example the less mobile holes, that build up a positive space charge in the semiconductor. This leads at least to a deformation, and possibly a complete shielding, of the externally applied electrical field and, consequently, causes a corresponding reduction of the measured signal current. Additionally, the charges trapped in the semiconductor are only slowly released in turn (detrapping), particularly from traps which, in terms of energy are, more deeply situated, so that the measured signal only decays slowly, even when the incident radiation is shut off. The response time of the detector to intensity modifications of the incident radiation is thus unacceptably lengthened for some applications. Moreover, if such a detector is used with a pulsed radiation source, the maximally possible pulse frequency is reduced due to this slow response time.

Due to this disadvantage, such directly converting radiation detectors could previously be utilized as individual quantum counters only given relatively low x-ray or gamma fluxes or could only be employed in applications that are slow and, thus, can accommodate the slow trapping and detrapping events. In counting operation, individual quanta can be resolved at rates of several $10^5$ quanta/seconds. For CdTe, the average photocurrent and the charge current, at a few $0.1\ nA/mm^2$, then still lie clearly below the dark current of approximately $1-10\ nA/mm^2$. Given employment as an individual quantum counter, the semiconductor material can "cure" this slight residual charge that is not carried off, namely in conjunction with the higher current-carrying capability of the contacts composed, for example, of gold (approximately $100\ nA/mm^2$).

For some applications, however, it is required that the detector responds linearly given a high data rate of up to $10^4$-times higher quantum fluxes. A charging of up to 1 $\mu A/mm^2$ is thereby achieved, which is about ten times above the dark current and that can no longer be compensated in adequate time.

SUMMARY OF THE INVENTION

It is therefore an object of the present invention to provide a directly converting radiation detector, particularly for high-energy radiation, that exhibits an improved response speed given high measuring precision even with a high active semiconductor layer thickness that lies in the region of the average, free path length for the charge carriers.

The underlying idea of the invention is to compensate the residual charges adhering to imperfections in the semiconductor by an additional injection of oppositely charged carriers. This is realized in the inventive detector by applying an injector electrode on a principal surface of the semiconductor body in addition to the first and second conventional electrodes, respectively applied on opposite principle surfaces of the semiconductor body. The potential of this injector electrode is set in conformity with the polarity of the actual test electrodes, but the injector voltage adjacent between the injector electrode and the second (cooperating) electrode is lower than the operating voltage of the detector between the first and second electrodes.

The first electrode and the injector electrode, which are both fashioned on the same principal surface of the semiconductor body, have an interdigital structure. This means that each of these electrodes has projecting elements, with the projecting elements of the two electrodes engaging into one another, so that an alternating arrangement of the two electrodes is present on the surface. This has the advantage that the injection of charge carriers for the compensation of charged traps ensues uniformly over the surface. The secondary dark current generated in this way can thus also flow through a high volume proportion of the entire semiconductor and can thereby compensate the (residual) charges adhering therein. The volume covered by the injector current, and thus the compensation of trapped residual charges, increases the more finely structured the injector electrode is, or the more fine the parts of the interdigital structure of injector and first electrode are. The compensation is thus also independent of the surface area of the injector electrode relative to the first electrode. This surface area ratio can be significantly lower than 1 and, for example, may be 0.1 through 0.5. The high surface area of the first electrode guarantees that the signal current is reduced to only an insignificant degree.

A metal is preferably selected for the material of injector electrode that forms a lower Schottky barrier for the charge carriers to be injected than the metal of the signal electrode (first electrode). The transfer of the charge carriers injected from the injector electrode into the semiconductor body is thus facilitated and electrons a secondary dark current is generated between the injector electrode and the second electrode that compensates the residual charges, but that does not influence the signal current.

Since the inventive detector compensates the disadvantages that accumulate with increasing thickness of the semiconductor body, or with increasing spacing of the electrodes, it can be implemented planarly and with a thickness that corresponds to the absorption length required for the absorption of the incident radiation.

In order to simultaneously obtain spatially resolved information about the incident radiation using the detector, the first electrode is divided into at least two, but preferably more than two sub-electrodes that are electrically separated from one another, whereby the signal current at each sub-electrode can be determined independently of the other sub-electrodes. Since a signal current can only be measured at the sub-electrodes in whose proximity a radiation quantum was absorbed in the semiconductor body, the incident radiation can thus be identified spatially (two dimensionally) resolved.

In a preferred embodiment of the invention, the semiconductor body is comprised of a compound semiconductor material having high capture cross-section for high-energy radiation, i.e., a material with a high atomic number. Preferred materials are therefore gallium arsenide and, in particular, cadmium telluride. For the latter semiconductor material, a preferred electrode combination is composed of indium and gold or platinum. Indium forms a lower Schoftky barrier relative to cadmium telluride for electrons and, moreover, generates an n-conductive doping due to diffusion into the cadmium telluride. When used as electrodes on cadmium telluride, by contrast, gold and platinum build up a Schottky barrier for electrons that is higher compared to indium. In the semiconductor body of p-conductive cadmium telluride, the injector and second electrodes can thus be composed of indium and the first electrode can be composed of gold or platinum. An n-doping is thereby obtained, and thus the p n-junction is generated under the second electrode. The p-doping of the semiconductor body under the injector electrode composed of indium is compensated by diffusion of indium.

For operating the inventive detector, an operating voltage in the non-conducting direction is applied to the first and second electrodes, this being usually in the range of 10–100 volts. A high-grade semiconductor material with a low level of imperfections and high-impendance is preferably selected. For example, intrinsic cadmium telluride has a specific resistance of $10^9$ Ω·cm, so that a voltage of 50 volts given a semiconductor thickness of approximately 1–2 mm is suitable in order to obtain a signal current that can be measured accurately.

The potential to be applied to the injector electrode leads to an injector voltage that is likewise formed in the non-conducting direction and that is selected lower than the operating voltage. The response behavior of the inventive detector is optimized due to the exact relationship of the injector voltage relative to the operating voltage. A relatively higher injector voltage leads to a higher secondary dark current, as well as to a fast compensation of residual charges that are trapped in the semiconductor body after the absorption of radiation, and thus produces a fast decay of the measured signal. At the same time, the maximum amplitude of the measurable signal is also reduced. The optimization then represents a compromise between a faster decay of the signal current and an associated higher measurement frequency that is obtainable, and a high measured signal and, and associated high sensitivity of the detector.

DESCRIPTION OF THE PREFERRED EMBODIMENTS

An embodiment of the invention in the form of a detector with a semiconductor body of cadmium telluride is described below.

Figure 1:
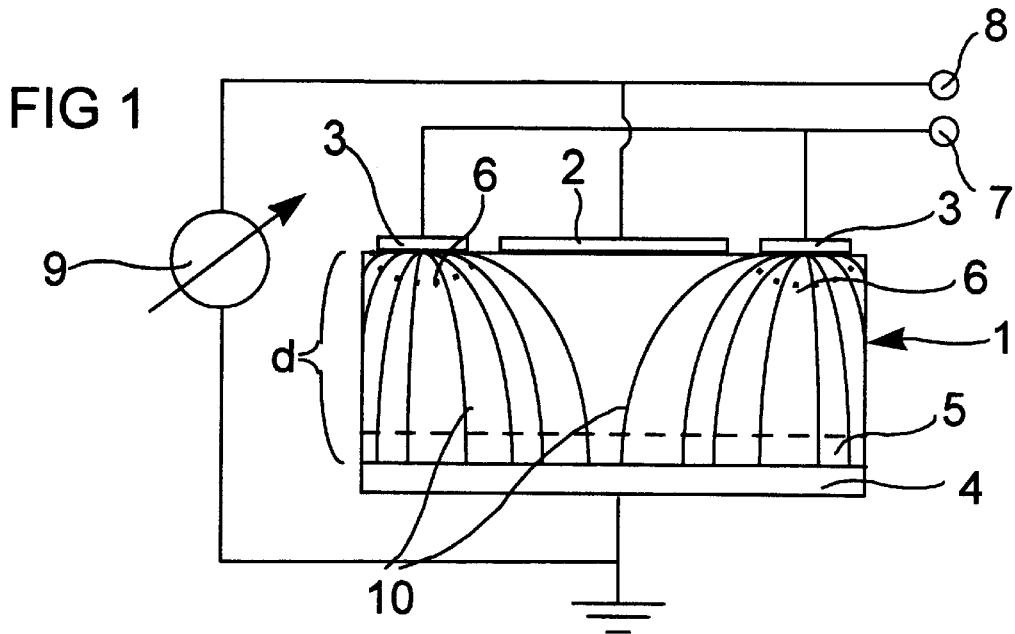
FIG. 1 show an inventive detector in a schematic cross section.

FIG. 1 shows a detector having a semiconductor body 1 which, for example, is lamina-shaped, composed of $p^-$CdTe and having a thickness d of, for example, 1.5 mm. A narrow, first electrode 2 that, for example, is fashioned strip-like as well as an injector electrode 3 that is narrower relative thereto and, for example, likewise fashioned strip-like are applied to the first surface of the semiconductor body 1. In FIG. 1, only one strip of the first electrode 2 that is neighbored on both sides by two strip of the injector electrode that are narrower relative thereto is shown. A thin gold layer having, for example, a thickness of 1 μm serves as material for the first electrode 2, whereas the injector electrode 3 is constructed of an indium layer that is approximately 1 μm thick. A second electrode 4 that, for example, is composed of a thin indium layer applied surface-wide is situated at the opposite, second principal surface of the semiconductor body 1.

An n-doped region 6 is located under the injector electrodes 3 and an n-doped region 5 that, for example, has arisen by drive-in of indium of the electrodes into the semiconductor body 1 is located under the second electrode 4. In this way, a blocking pn-junction is respectively formed between the first electrode 2 and the injector electrode 3 as well as between the first electrode 2 and the second electrode 4. In addition, the injector electrode 3 as well as the first electrode 2 are connected as the cathode relative to the second electrode 4. In the exemplary embodiment, the second electrode 4 is therefore connected to ground voltage, the electrical connection 7 for the injector electrode is biased at −45 volts and the electrical connection 8 for the first electrode is biased at −50 volts. The injector voltage applied to the injector electrode 3 with respect to ground level is thus 10% lower than the operating voltage at the first electrode 2 with respect to ground. A measuring instrument 9 connected in parallel to the electrodes 2 and 4 is schematically shown in the FIG. 1.

As soon as the electrodes lie at the potentials mentioned, electrons are injected into the semiconductor body 1 by the injector electrode 3, these electrons flowing along the indicated current paths 10 to the second electrode 4, lying at a more positive level. This injected (secondary) dark current is independent of the incident, external radiation and is favored by the low Schottky barrier between the injector electrode 3 and the semiconductor body 1. The positively charged traps in the interior of the secondary conductor body 1 lying in the region of these current paths 10 are discharged by this injected dark current and are thus rendered ineffective. The volume percentage of the semiconductor body 1 that is covered by this injected dark current increases the more finely divided the applied electrode structures for the injector electrode 3 and the first electrode 2 are made and the smaller the spacing between them is dimensioned.

Figure 2A:
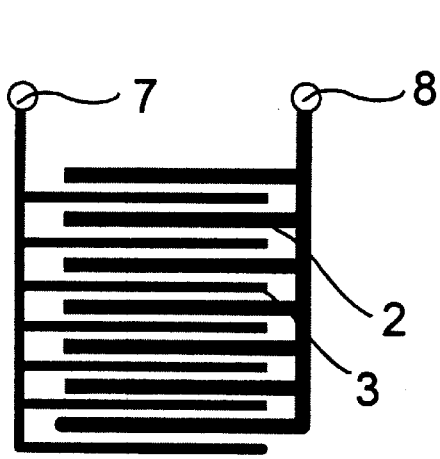
FIGS. 2a, 2b and 2c show different possible arrangements of an interdigital electrode structure the inventive detector.
Figure 2B:
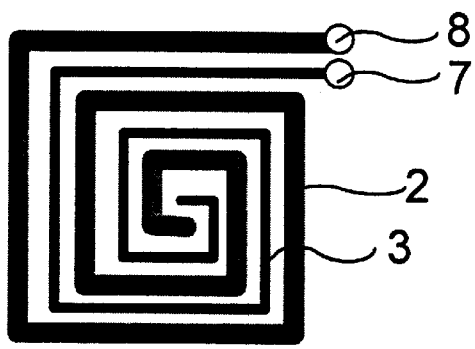
Figure 2C:
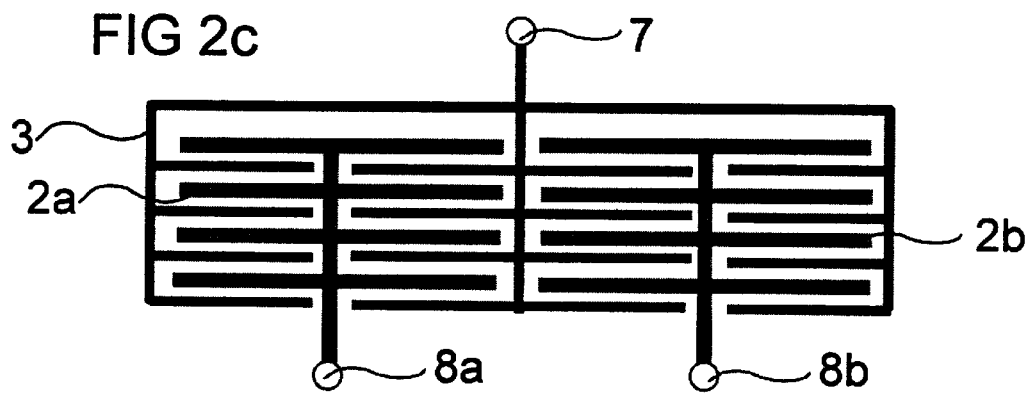

In a schematic plan view, FIGS. 2a, 2b and 2c show possible interdigital electrode arrangements at the first principal surface of the semiconductor body 1.

FIG. 2a shows a simple embodiment wherein the injector electrode 3 as well as the first electrode 2 are fashioned as comb-like structures whose teeth mutually interengage.

A further possibility for structuring the electrodes at the first principal surface is by a helical arrangement of the injector electrode 3 and the first electrode 2 proceeding parallel to one another, as shown in FIG. 2b. An alternating sequence of two electrode structures 2 and 3 is obtained at every plane of section vertical to the illustrated electrode plane, as shown excerpted in FIG. 1.

FIG. 2c shows a further electrode arrangement wherein the two electrodes again engage comb-like. As a fundamental difference compared to the embodiments of FIGS. 2a and 2b, the first electrode 2 is divided in the version of FIG. 2c into two independent sub-electrodes 2a and 2b electrically separated from one another that can measure signal currents independently of one another. The sub-electrode 2a has an electrical connection 8a and the sub-electrode 2b has an electrical connection 8b. Dependent on the location at which charge carrier pairs are generated due to incident radiation, one thus obtains a spatially (2D) resolved detection of the incident radiation. Dependent on the size of the semiconductor body 1, or dependent on the area available, the first electrode 2 can be formed of a larger number of sub-electrodes that, distributed side-by-side in a row or over the surface, enable a one-dimensional or two-dimensional topical resolution of incident radiation.

Figure 3:
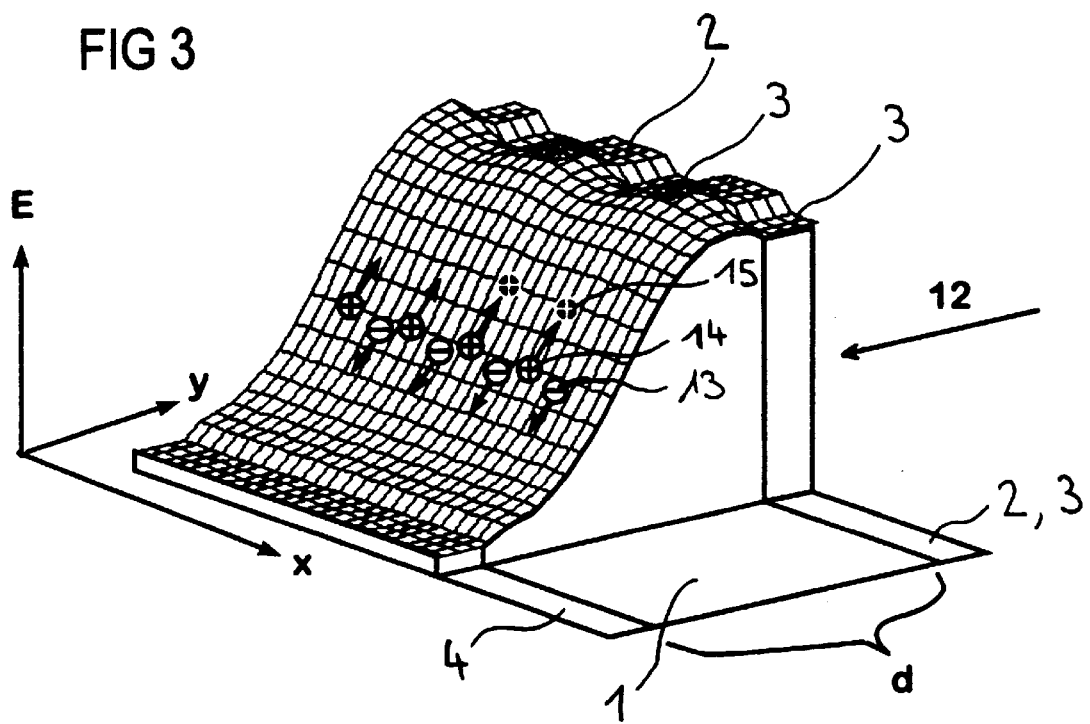
FIGS. 3 and 4 show a schematic distribution of potential in the detector of FIG. 1.

FIG. 3 shows three-dimensionally the distribution of potential for charge carriers in the cross-sectional plane shown in FIG. 1. The spatial coordinates within the plane correspond to the x-axis and the y-axis, whereas the potential energy E of the electrons 13 in the conduction band is shown along the z-axis. With inverse sign, this value corresponds to the potential energy of holes 14 in the valence band. As can be seen in FIG. 3, a potential gradient exists between the first electrode 2 and the injector electrode 3, and between the second electrode 4 and the first electrode 2, and a second potential gradient, smaller by contrast, exists between the first electrode 2 and the injector electrode 3. The exact amplitude of the (energy) potentials at the electrodes 2, 3 and 4 arises only from the applied electrical potential, whereas the energy potential E across the semiconductor body 1, i.e., in the illustrated plane of section of the semiconductor body 1, is additionally intensified by the prevailing doping and by the internal field of the p-n junction that is thereby built up. The comparatively high potential wall in the proximity of the plane of section from the first electrode 2 to the semiconductor body 1 is based on the Schottky barrier (for electrons) that the electrode material (gold or platinum) produces relative to the semiconductor body 1 (CdTe). A potential wall that is noticeably lower relative thereto arises at the boundary surface between injector electrode 3 and semiconductor body 1.

Shown in FIG. 3 are charge carrier pairs 13/14 that have already formed due to a high-energy radiation in the semiconductor body 1 incident along the arrow 12. Corresponding to the potential gradient valid for the respective charge carrier type, these now move to the electrodes having the lowest energy potential for them, to the second electrode 4 and first electrode 2 in the present case. Further, traps 15 due to voids or imperfections are symbolically shown in FIG. 3 that can capture and trap charge carriers of a specific type. Even if no further radiation 12 is incident, charged traps 15 thus remain in the semiconductor body 1.

Figure 4:
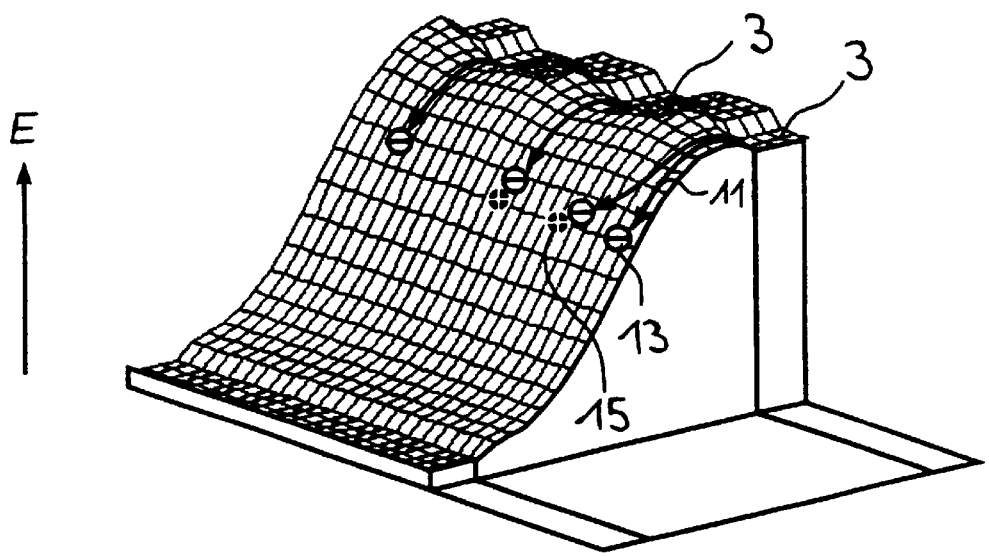

The secondary dark current is shown by arrows 11 and charge symbols 13 in FIG. 4. This secondary dark current is generated by injection of electrons 13 from the injector electrode 3 into the semiconductor body 1 independently of the incident radiation 12. A portion of the injected electrons is captured by the charged traps 15 and can compensate for these. The other electrons migrate to the second electrode 4. Since this dark current flows virtually exclusively between the injector electrode 3 and the second electrode 4, it does not contribute to a measured signal registered by the measuring instrument 9 between the first electrode 2 and the injector electrode 4. The measuring instrument responds only to the radiation-induced "photocurrent" whose creation, as just explained, is shown in FIG. 3.

It is assumed in a further exemplary embodiment of the invention that the traps in the semiconductor body can be negatively charged. Since these traps 16 can only be compensated by injection of positively charged charge carriers (holes) 14, an opposite polarization of all electrodes compared to the first exemplary embodiment is required for this case. Given, for example, a second electrode 4 again at zero potential, the first electrode 2 and the injector electrode 3 must be at a potential that is positive relative thereto in this case. The injection voltage between the injector electrode 3 and the second electrode 4 is selected, for example, 10% below the operating voltage that is applied between the first and second electrodes 2 and 4. The injector electrode 3 is composed of a material that forms a lower Schottky barrier (for holes) to the semiconductor body than the first electrode 2.

Figure 5:
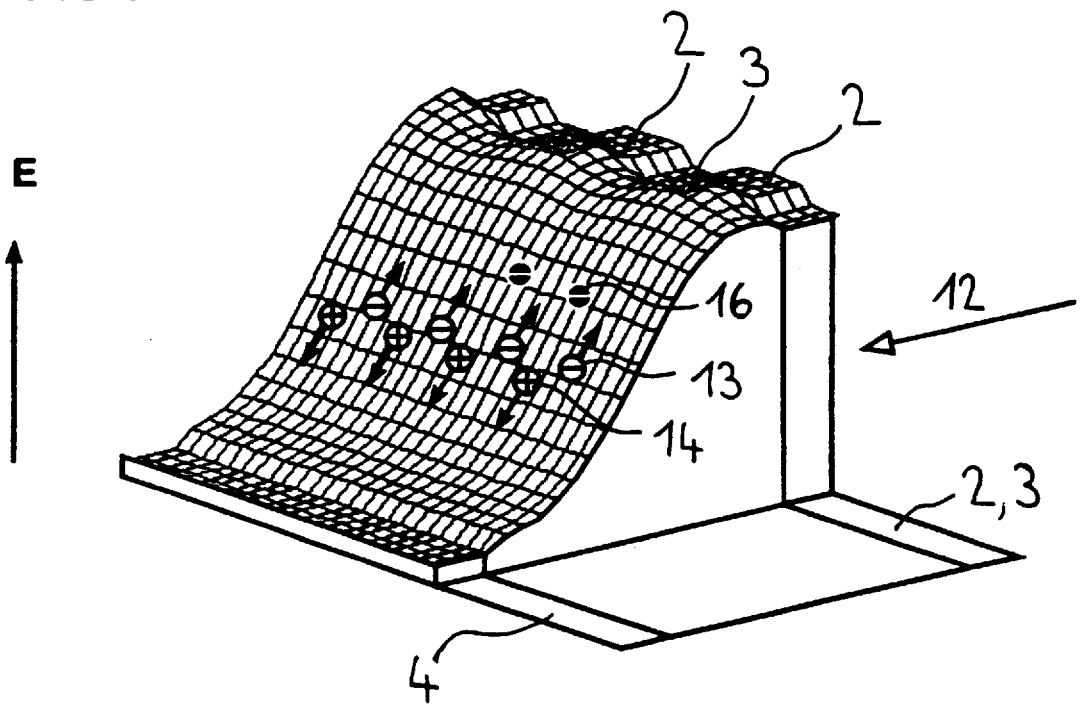
FIGS. 5 and 6 show Schematic distribution of potential in a further detector.

FIG. 5 shows the distribution curve of potential over a cross-sectional surface through such a detector. The potential energy for holes is shown on the z-axis, whereas the x-axis and the y-axis indicate the two-dimensional space coordinates of the illustrated plane of section. Such a detector can also be formed by a semiconductor body 1 composed of cadmium telluride with pin diode structure. The orientation or direction of the semiconductor junction is such that the arising, internal field is intensified by the applied, external potential. The n-doped region therefore lies under the second electrode 4.

As in the first exemplary embodiment, the charge carrier pairs 13 and 14 injected by the radiation 12 are collected at the electrodes 2 and 4, but here, the electrons 13 are collected at the first electrode 2 and the holes 14 are collected at the second electrode 4.

Figure 6:
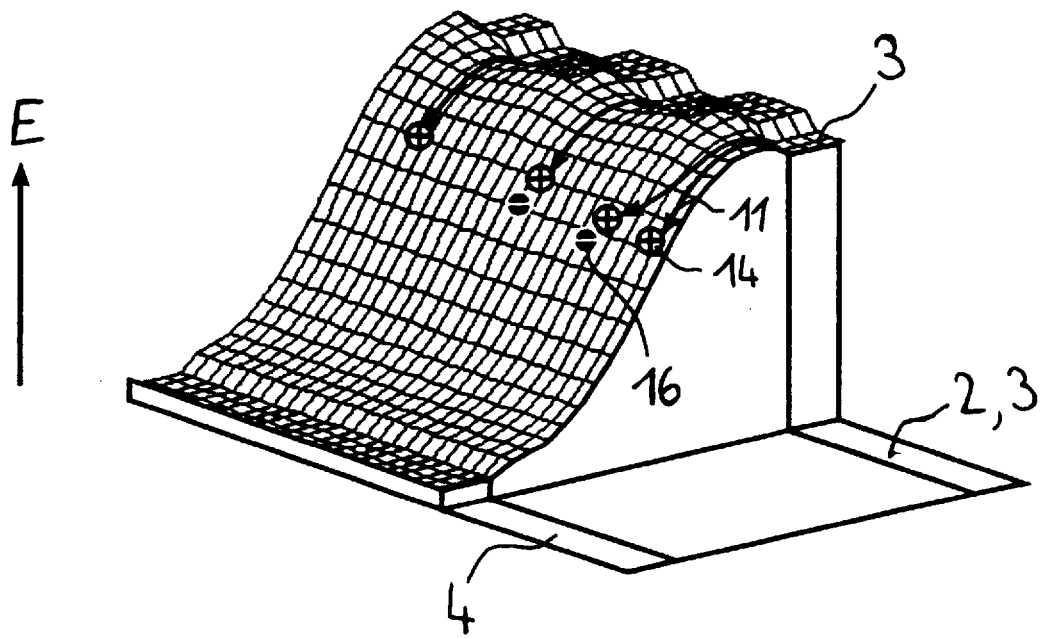

Only the secondary dark current 11 is again shown in FIG. 6. In this exemplary embodiment, the injector electrode 3 injects positively charged carriers 14 into the semiconductor body 1 in order to compensate the negatively charged traps 16. This dark current 11, as before does not contribute to a measured signal at the measuring instrument 9 connected to first and second electrodes 2 and 4. Again, the interdigital structure makes it possible for the secondary dark current 11 to flow through a high volume percentage of the semiconductor body 1.

The inventive radiation detector exhibits good response behavior for incident radiation as well as a fast decay of the signal after the radiation is turned off. This enables a fast measurement, or a high measuring frequency given pulsed radiation. Since this measuring frequency is now no longer dependent on the semiconductor body being made thicker, the inventive detector can be implemented with a thickness corresponding (matched) to the absorption length. This guarantees a high measured signal and thus a sensitive detector. When the inventive detector is operated for the detection of x-radiation, then an elevated signal modulation frequency is possible. The inventive detector has a significantly simplified structure compared to non-directly converting detectors operating on the basis of scintillators or ionization tubes. In addition, the above-described features of the inventive radiation detector allow a simple manufacture of detector lines or detector arrays with which a one-dimensional or two-dimensional spatial resolution of the incident radiation signal is possible.

Although modifications and changes may be suggested by those skilled in the art, it is the intention of the inventors to embody within the patent warranted hereon all changes and modifications as reasonably and properly come within the scope of their contribution to the art.

We claim as our invention:

1. A radiation detector comprising:
    a semiconductor body having first and second opposite principal surfaces;
    a first operating electrode disposed on said first principal surface of said semiconductor body and a second operating electrode disposed on said second principal surface of said semiconductor body;
    means for applying an operating voltage across said first and second electrodes;
    measuring means for measuring a signal current between said first and second electrodes while said operating voltage is applied across said first and second electrodes and while radiation is incident on said first principal surface of said semiconductor body;
    an injector electrode disposed on said first principal surface of said semiconductor body;
    means for applying an injection voltage across said injector electrode and said second electrode for generating a dark current in said semiconductor body independent of said signal current, said operating voltage being independent of and higher than said injection voltage; and
    said first electrode and said injector electrode forming an interdigital structure on said first principal surface of said semiconductor body.

2. A radiation detector as claimed in claim 1 wherein said first electrode is comprised of a first material and said injector electrode is comprised of a second material different from said first material, and said second material forming a lower Schottky barrier for charge carriers in said semiconductor body than said first material.

3. A radiation detector as claimed in claim 1 wherein said semiconductor body comprises a pn structure.

4. A radiation detector as claimed in claim 1 wherein said semiconductor body has a pn structure.

5. A radiation detector as claimed in claim 4 wherein said semiconductor body has a doping of a first conductivity type under said first electrode and comprises a limited region below said injector electrode comprising a doping of a second conductivity type, opposite said first conductivity type.

6. A radiation detector as claimed in claim 1 wherein said semiconductor body has a pin structure.

7. A radiation detector as claimed in claim 6 wherein said semiconductor body has a doping of a first conductivity type under said first electrode and comprises a limited region below said injector electrode comprising a doping of a second conductivity type, opposite said first conductivity type.

8. A radiation detector as claimed in claim 1 wherein said first electrode covers a first area on said first principal surface and said injector electrode covers a second area on said first principal surface, with a ratio of said first area to said second area being substantially larger than one.

9. A radiation detector as claimed in claim 1 wherein said first electrode comprises at least two electrically separated sub-electrodes, each sub-electrode producing a respective, independently measureable signal current in said semiconductor body.

10. A radiation detector as claimed in claim 1 wherein said semiconductor body is comprised of cadmium telluride.

11. A method for operating a radiation detector comprising:
    providing first and second operating electrodes respectively on first and second opposite principal surfaces of a semiconductor body and producing an operating voltage across said first and second electrodes;
    providing an injector electrode on said first principal surface of said semiconductor body and producing an injection voltage, lower than said operating voltage, across said injector electrode and said second electrode;
    exposing said semiconductor body to pulsed radiation comprising a plurality of radiation pulses, at said first principal surface and thereby generating a signal current in said semiconductor body, said signal current having an amplitude;
    measuring said amplitude of said signal current between said first and second electrodes as a measurement of intensity of said radiation; and
    selecting said injection voltage relative to said operating voltage for producing a response time in said semiconductor body sufficiently fast for allowing said semiconductor body to produce an independently measureable signal current for each radiation pulse.

12. A method as claimed in claim 11 wherein said semiconductor body traps charges of a first polarity when exposed to said incident radiation, and wherein the step of selecting said injection voltage comprises producing an injection voltage between said injector electrode and said second electrode having a second polarity, opposite said first polarity.

13. A method as claimed in claim 11 wherein the step of selecting said injection voltage relative to said operating voltage comprises selecting said injection voltage as approximately 10% lower than said operating voltage.

14. A method as claimed in claim 11 wherein the step of exposing said semiconductor body to pulsed radiation comprises exposing said semiconductor body to pulsed x-rays.

15. A method as claimed in claim 11 wherein the step of exposing said semiconductor body to pulsed radiation comprises exposing said semiconductor body to pulsed x-rays for medical x-ray diagnostics.

* * * * *